United States Patent [19]

Oda

[11] Patent Number: 5,499,598
[45] Date of Patent: Mar. 19, 1996

[54] METHOD FOR PRODUCING A SILICON ROD

[75] Inventor: Hiroyuki Oda, Hikari, Japan

[73] Assignee: Tokuyama Corporation, Yamaguchi, Japan

[21] Appl. No.: 208,864

[22] Filed: Mar. 11, 1994

[30] Foreign Application Priority Data

Mar. 17, 1993 [JP] Japan ................. 5-056890

[51] Int. Cl.⁶ ................................. C30B 13/06
[52] U.S. Cl. ................. 117/49; 117/37; 117/40; 117/50; 117/933
[58] Field of Search ................. 117/49, 50, 37, 117/40, 933

[56] References Cited

U.S. PATENT DOCUMENTS

| | | | |
|---|---|---|---|
| 3,454,367 | 7/1969 | Reuschel | 117/933 |
| 3,781,209 | 12/1973 | Reuschel et al. | 117/933 |
| 4,094,730 | 6/1978 | Rahilly | 117/50 |
| 4,394,183 | 7/1983 | Jackson et al. | 117/40 |
| 4,572,812 | 2/1986 | Ciszek | 264/25 |
| 4,915,723 | 4/1990 | Kaneko et al. | 65/144 |
| 5,211,802 | 5/1993 | Kaneko et al. | 117/933 |
| 5,367,981 | 11/1994 | Maruyama | 117/49 |
| 5,436,164 | 7/1995 | Dumler et al. | 436/72 |

FOREIGN PATENT DOCUMENTS

| | | |
|---|---|---|
| 4137521 | 11/1990 | Germany . |
| 1-264920 | 10/1989 | Japan . |
| 898872 | 6/1962 | United Kingdom ..... 117/49 |

*Primary Examiner*—Robert Kunemund
*Attorney, Agent, or Firm*—Wenderoth, Lind & Ponack

[57] ABSTRACT

Silicon granules filled in a nonconductive cylinder are locally heated from outside of the cylinder using a local heating means, for example, a radio-frequency induction heating coil etc. to form a silicon granule sintering portion and a silicon melting portion, with gradually moving the local heating means in such a manner that the positions of the sintering portion and of the melting portion can be moved gradually. Concomitantly with the movement of the positions of the sintering portion and the melting portion, the melting portion in the original position is solidified to produce a silicon rod. According to this method, molten silicon is formed without contacting the inner wall surface of the cylinder and then solidified so that there can be obtained a silicon rod containing no impurities derived from the material of the cylinder.

10 Claims, 1 Drawing Sheet

METHOD FOR PRODUCING A SILICON ROD

The present invention relates to a method for producing a silicon rod from granular silicon. More particularly, the present invention relates to a method for producing a polycrystalline or monocrystalline silicon rod without any impurity contamination from a cylinder wall by the steps of partially melting granular silicon in a cylinder, of collecting the molten silicon around the longitudinal axis of the cylinder making the most of the surface tension of the molten silicon so that the molten silicon will not contact the inner wall surface of the cylinder, and of solidifying the molten silicon.

Granular silicon, so long as it remains granular, cannot be used for producing semiconductor silicon. For example, it is necessary to process a granular polycrystalline silicon, usually, into a rod-like monocrystalline ingot before it can be useful as a silicon for semiconductor use. Polycrystalline silicon can be used for solar cells. In this case, the polycrystals must be processed into ingots whose crystal grain diameter is relatively great, for example, not smaller than several millimeters.

To produce monocrystalline silicon rods from granular silicon, there has conventionally been used the Czochralski (CZ) method in the main. The CZ method is a method in which granular silicon is filled in a quartz crucible, the total amount of the silicon is molten in the crucible, and a monocrystal is prepared from the molten silicon. However, the CZ method has a problem that not small amount of impurities such as oxygen, aluminum and the like diffuse or elute from the crucible during the melting so that silicon rods produced are contaminated with such impurities.

Most important criterion for specifying the quality of polycrystalline silicon is the content of impurities in the product. It is indispensable to clearly indicate chemical analysis data of silicon before the products are put into marketplace. The amounts of impurities in the product are usually determined according to ASTM methods. For example, dopant impurities such as P, B, Al and As are analyzed by a photoluminescence method, and C and O are analyzed by an infrared absorption method. These methods both require materials to be converted into monocrystals before they can be analyzed since without such conversion no measurement can be made. In the case where materials to be measured have been converted into monocrystals by means of the CZ method, however, no measurement can be made for Al and O since they take up a large amount of impurities from substances other than silicon. Generally, from a rod-shaped polycrystalline silicon produced by the Siemens method and available on the market, there is scooped out a stick-shaped sample, which sample is converted into a monocrystal by a floating zone (FZ) method before it can be analyzed. Since it is impossible to directly convert granular silicon into a monocrystal by the FZ method, there is needed a technique which molds granular silicon into a stick-shaped silicon in order to convert the granular silicon into a monocrystal without incorporating impurities.

On the other hand, there has been known a method for continuously casting polycrystalline silicon rods from granular silicon by means of radio-frequency induction heating (U.S. Pat. No. 4,572,812, Japanese Patent Application Laid-Open No. Hei 1-264920, and U.S. Pat. No. 4,915,723). This method is to melt all the silicon granules in a bottomless crucible constructed with a plurality of conductive walls split in a peripheral direction by radio-frequency induction heating while feeding the silicon granules, and then cooling the molten silicon to continuously cast silicon rods. In the method, the molten silicon is forcibly isolated by the inner wall surface of the crucible due to repulsion between the magnetic force generated by the current which flows in the conductive wall of the crucible and the magnetic force generated by the current induced in the molten silicon by the current in the conductive wall of the crucible. However, it is difficult to completely prevent the contact between the molten silicon and the inner wall surface of the crucible. Therefore, a problem arises that the silicon rods thus produced suffer contamination of impurities from the crucible.

SUMMARY OF INVENTION

Accordingly, an object of the present invention is to provide a method for producing a silicon rod by melting granular silicon and then solidifying the molten silicon in which the molten silicon is prevented from contacting the inner surface of the crucible so that a silicon rod containing no impurity can be obtained.

As a result of extensive research with view to achieving the above object, the present inventors have realized that molten silicon has a very large surface tension and that silicon granules are sintered at temperatures a little below the melting point of silicon so that the grains bind together, and making most of these phenomena they have been successful in solidifying molten silicon in a state in which it is held at a position remote from the inner wall surface of a crucible.

Therefore, according to the present invention, there is provided a method for producing a silicon rod, comprising the steps of: filling silicon granules inside a nonconductive cylinder arranged so that its longitudinal axis is substantially vertical; heating the silicon granule at a local heating region thereof using a local heating means from outside of the cylinder to form, in a section inside the cylinder which is close to the local heating means, a silicon granule sintering portion and a molten silicon portion not contacting the inner wall surface of the cylinder; and gradually moving the local heating region in the direction of the longitudinal axis of the cylinder to alternately causing solidification of the molten portion, melting of the sintering portion, and formation of a new sintering portion; whereby forming inside the cylinder a silicon rod solidified without contacting the inner wall surface of the cylinder.

The method of the present invention makes the most of the phenomenon that when silicon granules having relatively small bulk densities melt and undergo volume reduction, the resulting molten silicon becomes to take a shape of cylinder due to its large surface tension. That is, silicon granules of relatively small bulk density, e.g., 1.0 to 1.5 g/ml when they melt give rise to molten silicon having a bulk density of 2.55 g/ml and its apparent volume reduces to about half (½) the original apparent volume. When the silicon granules filled in a cylinder are heated at a local heating region thereof using a local heating means from outside of the cylinder, there are formed a silicon granule sintering portion and a silicon melting portion in a region inside the cylinder and near the local heating means. Then, the local heating region is moved along the longitudinal axis of the cylinder so that the local heating region becomes more remote from the silicon melting portion and approaches the silicon granule sintering portion. This results in cooling of the silicon melting portion to solidify the molten silicon and the silicon granule sintering portion is heated more intensely than previously so that a new silicon melting portion is formed, with unsintered silicon granules being heated to form a new silicon granule sintering portion. Thus, the silicon melting portion is fixed on one end thereof to the cooled and solidified silicon and on the other end thereof is fixed to the silicon granule sintering portion. Since the molten silicon which has underwent volume reduction is fixed at both ends thereof as stated above, the molten silicon, due to surface tension, forms a cylindrical rod around the longitudinal axis of the cylinder having a diameter smaller than that of the cylinder (e.g., the rod having a diameter about $1/\sqrt{2}$ times as large as the inner diameter of the cylinder). Continued movement of the local heating means in the manner as described above results in continued solidification of the silicon melting portion, continued melting of the silicon granule sintering portion and continued formation of a new silicon granule sintering portion in order. As a result, the length of the above-described cylindrical silicon rod increases gradually.

According to the method of the present invention as described above, the inner wall surface of the cylinder and the molten silicon do not contact each other so that there will be no fear that the molten silica is contaminated with impurities derived from the material of the cylinder, thereby assuring the production of silicon rods free of such impurities.

The silicon granules which can be used in the present invention may be either polycrystals or monocrystals, and any conventional silicon granules may be used without any limitation. In the present invention, it is necessary to carry out local heating in order to form a silicon granule sintering portion and a silicon melting portion. So, the silicon granules preferably have a low thermal conductivity so that the heat of the melting portion will not readily be transferred to the sintering portion. For this purpose, it is preferred that the silicon granules be spherical, ellipsoidal or the like so that the neighboring silicon granules can contact each other in a contact area as small as possible.

The particle diameter of the silicon granules is not limited particularly. Generally, those silicon granules which are 0.7 to 1.5 mm in diameter are easily available. The silicon granules which can be used in the present invention particularly preferably are those silicon granules which have minute silicon powder on the surfaces of the silicon granules of spherical shape or something like that. Such silicon granules are advantageous in that they have relatively low intergranular thermal conductivity and can be readily sintered. They can be prepared in a fluidized bed reactor.

In the present invention, the above-described silicon granules are filled inside the cavity of a nonconductive cylinder arranged so that its longitudinal axis is substantially vertical. The cylinder must be nonconductive. If the cylinder is electroconductive, the use of radio-frequency induction heating as a heating means results in generation of radio-frequency induction current, which flows in the cylinder body to heat the whole cylinder, so that all the silicon granules filled in the cylinder cavity are molten. This makes it impossible to practice the method of the present invention. The material of the cylinder is not limited and any material can be used so far as it is nonconductive. Usually, there can be used ceramics such as alumina, silica, and silicon nitride. Particularly preferred is quartz glass since it is transparent and allows seeing through the inside and since it is less contaminated with impurities. The nonconductive cylinder may be of any sizes that can be determined depending on the sizes of silicon rods to be produced.

The cross sectional shape of the cylinder in a direction vertical to its longitudinal axis is not limited particularly. However, it is preferred that such cross sectional shape be a circle or a polygon similar to a circle in order to achieve uniform heating in a direction vertical to the longitudinal axis of the cylinder.

Means for heating the silicon granule at a local heating region thereof is not limited particularly, and preferably includes, for example, radio-frequency induction heating, infrared ray heating, micro-wave dielectric heating, etc. As is well known, silicon has the characteristics that its electric resistivity decreases according as its temperature elevates, and on the other hand, it is also well known that in radio-frequency induction heating, a higher induction current flows in a material having a lower electric resistivity. Accordingly, when silicon is heated by radio-frequency induction heating, a portion having a higher temperature becomes much higher in temperature to be melted whereas another portion whose temperature is insufficiently high is heated only a little. In other words, radio-frequency induction heating allows easy local heating. Therefore, it is preferred in the present invention to use radio-frequency induction heating to achieve local heating easily.

Local heating of the silicon granules from outside of the nonconductive cylinder is preferably performed uniformly in a direction vertical to the longitudinal axis of the cylinder. Therefore, there is usually used a method for heating the cylinder using a radio-frequency induction heating coil which surrounds the nonconductive cylinder.

Upon the formation of the silicon sintering portion and the silicon melting portion one adjacent another in a direction of the longitudinal axis of the nonconductive cylinder by local heating, excessive heating forms too large a melting portion, resulting in that the molten silicon flows out of a predetermined region. Therefore, it is preferred to experimentally determine a suitable degree of heating in advance so that the melting portion should not become too large. Generally, it is preferred that the length of the silicon melting portion in the direction of its longitudinal axis be not smaller than half (½) the diameter of the solidified silicon rod, usually 0.5 to 3 cm and particularly 1 to 2 cm. In order to obtain such a length of the melting portion, it is preferred to use an output of 5 to 10 KW at a frequency of 2 MHz, for example, when radio-frequency induction heating is adopted.

BRIEF DESCRIPTION OF DRAWINGS

Next, preferred embodiments of the present invention will described in detail with reference to the accompanying drawings, in which.

DETAILED DESCRIPTION OF INVENTION

In the present invention, as described above, the local heating region which is created by the local heating means must be moved in a direction of the longitudinal axis of the nonconductive cylinder in order to gradually increase the length of the molten, cooled and then solidified silicon rod in such a manner that the local heating region can become more remote from the silicon melting portion and approach the silicon granule sintering portion. The movement of the local heating region in a direction of the longitudinal axis of the cylinder can be achieved by relative motion of the heating means with respect to the cylinder, for example, by lowering or elevating the cylinder along its longitudinal axis with respect to the heating means which is fixed.

Figure 1:
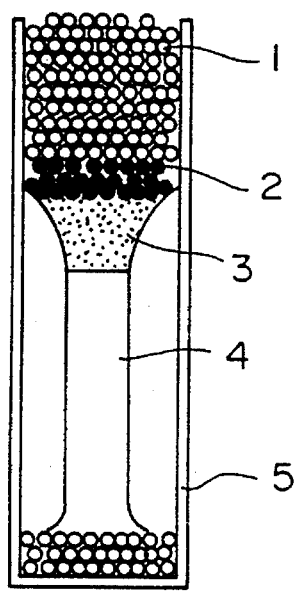
FIG. 1 is a schematic view illustrating a preferred embodiment of the method of the present invention.

FIG. 1 illustrates how the local heating is performed in the case where a fixed local heating means (not shown) is used and where the cylinder is lowered along its longitudinal axis with respect to the fixed local heating means, i.e., in the case where the local heating region is relatively moved from a lower portion to an upper portion of the cylinder. As is shown in FIG. 1, a silicon melting portion 3 is formed in an inner section of a cylinder 5, the inner section being near the local heating means. Adjacent to the upper end of the silicon melting portion 3 is formed a silicon sintering portion 2, above which there is a silicon granule filling portion 1. Below the melting portion 3 there is a solidified silicon rod 4 which has been obtained by spontaneous cooling of the melting portion 3. Further elevation of the local heating region results in concomitant elevation of the positions of the silicon granule sintering portion 2 and of the silicon melting portion 3 so that the length of the silicon rod 4 increases. According to this method, there can be produced cylindrical silicon rods containing no impurities. However, if the particle diameter of the silicon granules is too large, each silicon granule has a weight which is greater than the strength of the bonding between the silicon granules in the sintering portion so that silicon granules could fall from the sintering portion due to their weight and contaminate or harm the melting portion underlying the sintering portion. Therefore, when the above-described method is to be used, it is preferred that the silicon granules have particle diameters not larger than 3 mm.

Figure 2:
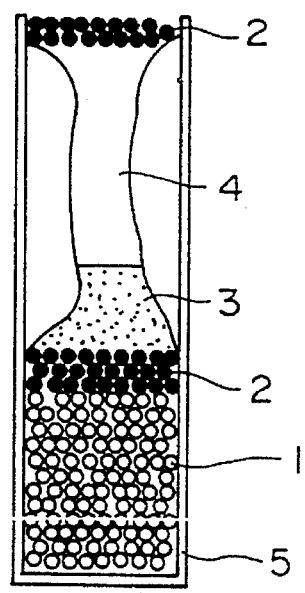
FIG. 2 is a schematic view illustrating another preferred embodiment of the method of the present invention.

FIG. 2 illustrates how the local heating is carried out in the case where a fixed local heating means (not shown) is used and the cylinder is elevated along its longitudinal axis with respect to the fixed local heating means, i.e., in the case where the local heating region is moved from an upper portion to a lower portion of the cylinder. Also, in the case of FIG. 2, a silicon melting portion 3 is formed in an inner section of a cylinder 5, the inner section being near the local heating means. Above the silicon melting portion 3, there exists a silicon rod 4 solidified by spontaneous cooling while below the silicon melting portion 3, there is a silicon granule sintering portion 2, below which there is a silicon granule filling portion 1 which is heated only insufficiently and remains unsintered yet. When the local heating region is further lowered, the positions of the silicon granule sintering portion 2 and of the silicon melting portion 3 are lowered concomitantly so that the length of the silicon rod 4 increases. According to this method, since the molten silicon tends to flow down, the molten silicon does not collect or concentrate around the longitudinal axis of the cylinder, result in the formation of a columnar silicon rod having a more or less curved contour. However, this method is not limited to any particular particle diameter range, and there may be used any silicon granules regardless of their particle diameter as a raw material. After it is produced, the curved columnar silicon rod can be regularized in shape to have a regular columnar contour similar to the columnar silicon rod produced by the method as illustrated in FIG. 1 by moving the local heating region from a lower portion to an upper portion of the cylinder.

The speed of movement of the local heating region, i.e., the speed of relative movement of the local heating means with respect to the cylinder, has a suitable range depending on the diameter of the nonconductive cylinder and, hence, it is preferred to experimentally determine such a suitable diameter range in advance. For example, when a nonconductive cylinder of 30 mm in diameter is used, it is preferred that the local heating region move at a speed of 2 to 8 mm/minute.

As stated above, the local heating region is relatively moved with respect to the nonconductive cylinder and the sintering portion and the melting portion are gradually moved so that the melting portion can be cooled to form a solidified portion, thereby producing a silicon rod.

In the present invention, when radio-frequency induction heating is used alone as a heating means, the efficiency of heating at an initial stage is very low based on the above-described characteristics of silicon and of radio-frequency induction heating. In order to improve this, it is preferred to use a method in which at an initial stage of heating, a carbon plate 7 arranged at a portion where the heating is to be initiated is heated by means of a radio-frequency induction heating coil 6 to heat silicon granules with heat radiated from the carbon plate 7. In this case, in order to achieve uniform heating in a direction vertical to the longitudinal axis of the nonconductive cylinder 5, it is preferred to rotate the nonconductive cylinder 5 around it longitudinal axis.

According to the method of the present invention, either monocrystalline or polycrystalline silicon rods can be produced. When monocrystalline silicon rods are to be produced, a method may be used advantageously in which a seed monocrystal is placed on the bottom of the nonconductive cylinder, and the local heating region is moved from the lower to the upper as shown in FIG. 1. The monocrystals produced by this method often have disturbed lattice structures and, hence, it is preferred to further subject the monocrystals to a FZ method or the like in order to obtain monocrystals for use in semiconductors.

According to the method of the present invention, molten silicon can be solidified with holding the molten silicon so as not to contact the inner wall surface of the crucible. Also, in the method of the present invention, the distance between the molten silicon and the inner wall surface of the crucible is greater than in a conventional continuous casting method. This makes loss of heat less than conventionally, reducing the amount of heat transferred from the molten silicon to the crucible. As a result, the contamination of impurities from the crucible can be prevented completely.

Monocrystalline silicon produced by the conventional CZ method contains oxygen contaminated as a result of melting of the quartz crucible in an amount of up to 20 ppm. Impurities such as oxygen and aluminum as well as trace impurities in silicon granules cannot be analyzed only after the production of monocrystals since the method for measurement is limited. Moreover, since contamination of impurities occurs during the production of monocrystals as described above, it was difficult to determine the amounts of impurities contained in the original silicon granules. However, monocrystalline silicon produced by the method of the present invention and a FZ method in combination is free of contaminants which would otherwise migrate into silicon during the production process, and, hence, the amounts of impurities contained in the original silicon granules can be estimated by the analysis of the impurities in the monocrystalline silicon thus produced. In other words, the analysis of trace impurities in silicon granules can be performed with ease.

Hereafter, the invention will be described in detail by examples. However, the present invention should not be construed as being limited thereto.

EXAMPLE 1

Figure 3:
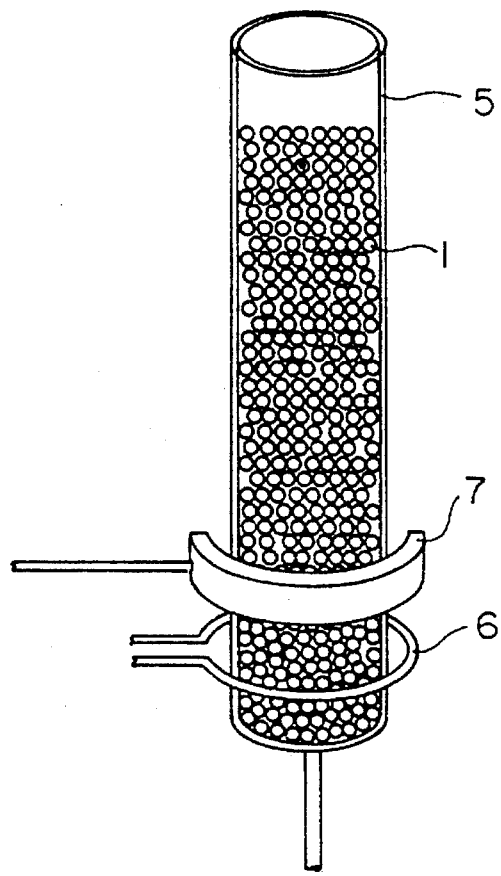
FIG. 3 is a schematic view showing an apparatus prior to initiation of its operation according to the method of the present invention.

Polycrystalline silicon of 1.2 mm in average particle diameter produced in a fluidized bed reactor was used as granular silicon. A quartz glass cylinder 5 of 150 mm in longitudinal length, and 7 cm$^2$ in cross section in a direction vertical to its longitudinal axis was placed as shown in FIG. 3 so that the longitudinal axis of the cylinder was vertical, and silicon granules 1 were filled in the cylinder.

At an initial stage of the heating, a radio-frequency induction heating coil 6 was energized to heat a carbon plate 7 at an output of 7 KW (frequency: 2 MHz), and the cylinder 5 was rotated at a speed of 5 rpm until the silicon granules 1 reached a temperature high enough for them to be induction heated from heat radiated from the carbon plate 7.

After it was confirmed that there was induced current inside the silicon granules due to the radio-frequency induction heating and that the silicon granules began to release heat, the carbon plate was removed and at the same time the output of the radio-frequency was lowered from 7 KW to 5 KW. As a result, the silicon granules near the radio-frequency induction heating coil melted and the silicon granules positioned above the molten silicon were brought into a sintered state.

After such a steady state as described above was reached, the whole cylinder 5 was lowered at a moving speed of 5 mm/minute to relatively elevate the heating region. During the movement of the heating region, the radio-frequency output was kept at 5 KW so that the states of sintering, melting and solidification should not change.

Thus, a polycrystalline silicon rod of 20 mm in diameter and 120 mm in length was produced. The silicon rod was taken out of the cylinder and subjected to the conventional FZ method in argon gas to produce a monocrystalline silicon rod. Table 1 shows results of analysis of the monocrystalline silicon rod (Sample A).

For comparison, the same silicon granules as used in the above-described method were shaken in a quartz pipe to purposely contaminate the silicon granules with the quarts component. Thereafter, a monocrystalline silicon rod (Sample B) was produced. Table 1 also shows results of analysis of this silicon rod. For further comparison, a polycrystalline silicon rod produced by the Siemens method was directly converted into a monocrystal by the conventional FZ method (Sample C). Table 1 also shows results of analysis of this sample.

As shown in Table 1, Sample A had analytical values on aluminum and oxygen which closely resembled those of the silicon produced by the CZ method (Sample C), which indicates that Sample A was free of contamination with impurities. From the fact that the oxygen content of the monocrystalline silicon produced by the conventional CZ method was 20 ppm-atom, it can be seen that the silicon rod produced by the method of the present invention has a very high purity.

TABLE 1

| Element | Sample A | Sample B | Sample C |
| --- | --- | --- | --- |
| Al (ppb-atom) | <0.01 | 0.017 | <0.01 |
| O (ppm-atom) | 0.07 | 0.13 | 0.05 |

EXAMPLE 2

A polycrystalline silicon rod was produced in the same manner as in Example 1 except that the cylinder was moved in a reverse direction (i.e., according to the method illustrated in FIG. 2). The silicon rod thus obtained was a column more or less curved as compared with one obtained by the method of Example 1. A monocrystal was produced from the silicon rod in the same manner as in Example 1 and its composition was analyzed. As a result, the monocrystalline rod contained impurities in amounts as low as the monocrystalline rod obtained in Example 1.

I claim:

1. A method for producing a silicon rod, consisting essentially of the steps of:

filling silicon granules inside a nonconductive cylinder arranged so that its longitudinal axis is substantially vertical;

heating the silicon granules at a local heating region inside the cylinder using a local heating means disposed outside of the cylinder to form, in a section inside the cylinder which is close to the local heating means, a silicon granule sintering portion and a molten silicon portion which does not contact the inner wall surface of the cylinder; and gradually moving the local heating region in the direction of the longitudinal axis of the cylinder to progressively cause solidification of the molten portion, melting of the sintering portion, and formation of a new sintering portion;

wherein there is formed inside the cylinder a silicon rod from the molten granules which is solidified without contacting the inner wall surface of the cylinder.

2. The method of claim 1, wherein said nonconductive cylinder is made of quartz glass.

3. The method of claim 1, wherein said silicon rod has a cross section in a direction vertical to a longitudinal axis of said nonconductive cylinder.

4. The method of claim 1, wherein a radio-frequency induction heating coil is used as a local heating means.

5. The method of claim 1, wherein said local heating region is moved from a lower portion to an upper portion of said cylinder.

6. The method of claim 1, wherein said local heating region is moved from an upper portion to a lower portion of said cylinder.

7. The method of claim 1, wherein the movement of local heating region is achieved by relative motion of the local heating means with respect to the cylinder.

8. The method of claim 7, wherein the cylinder is lowered or elevated with respect to the local heating means which is fixed.

9. The method of claim 1, wherein the cylinder is rotated around its longitudinal axis while the granules are heated.

10. A method for producing a silicon rod, comprising the steps of:

filling silicon granules inside a nonconductive cylinder arranged so that its longitudinal axis is substantially vertical;

heating the silicon granules at a local heating region inside the cylinder using a local heating means disposed outside of the cylinder while rotating the cylinder around its longitudinal axis to form in the local heating region a silicon granule sintering portion and a molten silicon portion which does not contact the inner wall surface of the cylinder; and gradually moving the local heating region from a lower portion to an upper portion of the cylinder to progressively cause solidification of the molten portion, melting of the sintering portion, and formation of a new sintering portion;

wherein there is formed inside the cylinder a silicon rod from the granules which is solidified without contacting the inner wall surface of the cylinder.

* * * * *